US 9,754,794 B2

United States Patent
Wang

(10) Patent No.: US 9,754,794 B2
(45) Date of Patent: Sep. 5, 2017

(54) PLASMONIC NANO-LITHOGRAPHY BASED ON ATTENUATED TOTAL REFLECTION

(75) Inventor: Qingkang Wang, Shanghai (CN)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 129 days.

(21) Appl. No.: 14/425,326

(22) PCT Filed: Sep. 3, 2012

(86) PCT No.: PCT/CN2012/080910
§ 371 (c)(1),
(2), (4) Date: Jun. 15, 2015

(87) PCT Pub. No.: WO2014/032304
PCT Pub. Date: Mar. 6, 2014

(65) Prior Publication Data
US 2015/0348793 A1 Dec. 3, 2015

(51) Int. Cl.
*G03F 7/20* (2006.01)
*G03F 1/70* (2012.01)
(Continued)

(52) U.S. Cl.
CPC ............ *H01L 21/3081* (2013.01); *G03F 1/50* (2013.01); *G03F 7/70* (2013.01); *G03F 7/70008* (2013.01);
(Continued)

(58) Field of Classification Search
CPC . G03F 7/20; G03F 7/70; H01L 21/268; H01L 21/3081
See application file for complete search history.

(56) References Cited

U.S. PATENT DOCUMENTS 5,195,162 A 3/1993 Sultan et al.
7,469,083 B2 12/2008 Todori et al.
(Continued)

FOREIGN PATENT DOCUMENTS

CN 101441411 A 5/2009

OTHER PUBLICATIONS

"International Technology Roadmap for Semiconductors, Executive Summary", 2009, pp. 1-95.
Sung-Noon Hong et al., "Implementation of Surface Plasmon Resonance Planar Waveguide Sensor System", Microelectronic Engineering, 2010, pp. 1315-1318, vol. 87.
International Search Report and Written Opinion of the International Searching Authority, International application No. PCT/CN2012/080910, May 23, 2013.
Chen Jian et al., "Far-field Superlens for Nanolithography", Chin. Phys. B, 2010, pp. 034202-1-034202-7, vol. 19, No. 3.
Yongjun Lim et al., "Interference of Surface Plasmon Waves and Plasmon Coupled Waveguide Modes for the Patterning of Thin Film", IEEE Journal of Quantum Electronics, Apr. 2008, pp. 305-311, vol. 44, No. 4.
(Continued)

*Primary Examiner* — Stephen Rosasco
(74) *Attorney, Agent, or Firm* — Turk IP Law, LLC

(57) ABSTRACT

Techniques related to semiconductor fabrication are generally described herein. An example fabrication method may include coupling, by a lithographic equipment, a surface of a planar waveguide structure with a first surface of a photolithographic mask. Some example methods may also include directing, by the lithographic equipment, a lithography light beam into the planar waveguide structure, causing a surface plasmon being emitted from the surface of the planar waveguide structure when the lithography light beam is reflected by internal surfaces of the planar waveguide structure, effectuating an attenuated total reflection. Some example methods may further include directing, by the lithographic equipment, an evanescent wave caused by the surface plasmon through the photolithographic mask, wherein the evanescent wave has a sub-diffraction characteristic and is used as a photolithographic light source.

20 Claims, 5 Drawing Sheets

(51) Int. Cl.
*H01L 21/268* (2006.01)
*H01L 21/308* (2006.01)
*G03F 1/50* (2012.01)
*G03F 1/54* (2012.01)

(52) U.S. Cl.
CPC ........ *G03F 7/70325* (2013.01); *H01L 21/268* (2013.01); *G03F 1/54* (2013.01)

(56) References Cited

U.S. PATENT DOCUMENTS

| | | |
|---|---|---|
| 7,682,755 B2 | 3/2010 | Luo et al. |
| 7,738,752 B2 | 6/2010 | Yamagiwa et al. |
| 2010/0065726 A1 | 3/2010 | Zhong et al. |
| 2010/0290323 A1* | 11/2010 | Isogai .................... G11B 5/314 369/13.24 |

OTHER PUBLICATIONS

Zhao-Wei Liu et al., "Surface Plasmon Interference Nanolithography", NANO Letters, 2005, pp. 957-961, vol. 5, No. 5.
Heinz Raether, "Surface Plasmons on Smooth and Rough Surfaces and on Gratings", Springer Tracts in Modern Physics, 1988, vol. 111, pp. 7.
Xia Wan et al., "Nanolithography in the Quasi-far Field Based on the Destructive Interference Effect of Surface Plasmon Polaritons", J. Optical Society Am. A, May 2010, pp. 973-976, vol. 27, No. 5.

* cited by examiner

US 9,754,794 B2

PLASMONIC NANO-LITHOGRAPHY BASED ON ATTENUATED TOTAL REFLECTION

CROSS REFERENCE TO RELATED APPLICATION

The present application is a U.S. National Stage filing under 35 U.S.C. §371 of International Application No. PCT/CN2012/080910, filed on Sep. 3, 2012 and entitled "PLASMONIC NANO-LITHOGRAPHY BASED ON ATTENUATED TOTAL REFLECTION", the entire disclosure of which is hereby incorporated by reference herein

BACKGROUND

Unless otherwise indicated herein, the approaches described in this section are not prior art to the claims in this application and are not admitted to be prior art by inclusion in this section.

Optical lithography is a technology used for fabricating semiconductor mechanism and integrated circuits. The resolution of conventional optical lithography may often be limited by optical diffraction. The diffraction effect, which is based on the Huygen's Principle for light propagation, has an inverse correlation with the wavelength of the light used for conventional optical lithography.

Specifically, the wavelength of the lithographic light may limit the ability of a lithographic equipment to project a clear image of a small feature onto a wafer. The present disclosure appreciates that fabricating the sub-wavelength features of a sub-wavelength semiconductor product may require complicated and expensive imaging technologies in order to reduce the diffraction effects.

SUMMARY

Techniques related to semiconductor fabrication are generally described herein. In one or more embodiments of the present disclosure, methods for performing semiconductor fabrication are described.

Some example methods may include coupling, by a lithographic equipment, a surface of a planar waveguide structure with a first surface of a photolithographic mask. Some methods may further include directing, by the lithographic equipment, a lithography light beam into the planar waveguide structure, causing a surface plasmon being emitted from the surface of the planar waveguide structure when the lithography light beam is reflected by internal surfaces of the planar waveguide structure, effectuating an attenuated total reflection. Some methods may also include directing, by the lithographic equipment, an evanescent wave caused by the surface plasmon through the photolithographic mask, wherein the evanescent wave has a sub-diffraction characteristic and is used as a photolithographic light source.

In one or more embodiments of the present disclosure, methods for performing semiconductor fabrication are described that may include receiving, by a planar waveguide structure, a lithography light beam directed into the planar waveguide structure, wherein the lithography light beam achieves a total internal reflection while passing through the planar waveguide structure and causes a surface plasmon being emitted from a surface of the planar waveguide structure. Some methods may further include emitting, by the planar waveguide structure, an evanescent wave caused by the surface plasmon, wherein the evanescent wave is effective as a photolithographic light source.

Some embodiments of the present disclosure describe a lithographic structure for semiconductor fabrication that may include a photolithographic mask configured for a photolithographic operation. The lithographic structure may further include a planar waveguide structure configured to emit a surface plasmon when a lithography light beam reflecting off internal surfaces of the planar waveguide structure and achieving attenuated total reflection, and a bonding layer configured to couple the photolithographic mask with the planar waveguide structure, allowing an evanescent wave created from the surface plasmon to pass through the photolithographic mask.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
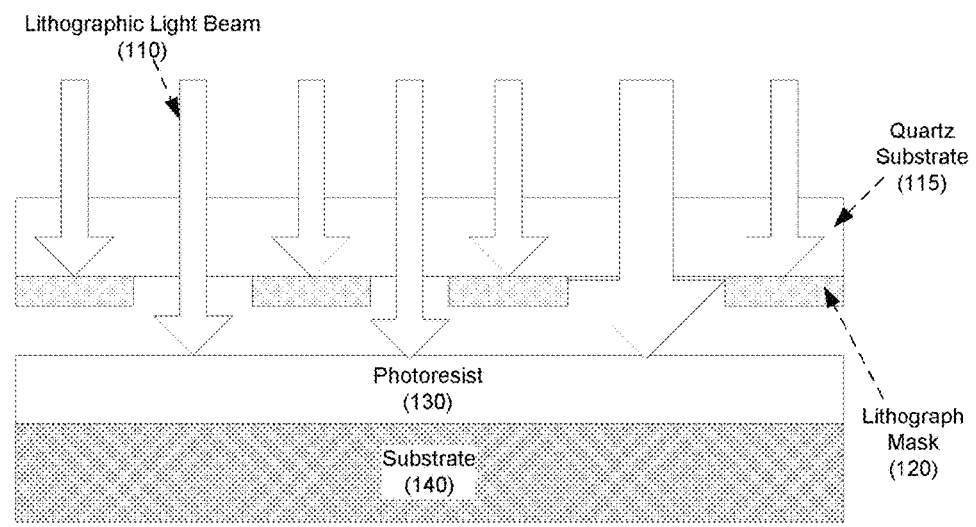
FIG. 1A shows a semiconductor structure during a conventional lithographic operation.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated herein.

This disclosure is drawn, inter alia, to methods and semiconductor structures related to the plasmonic nano-lithography based on Attenuated Total Reflection (ATR). Throughout the disclosure, the term "Attenuated Total Reflection" may broadly refer to a physical/optical phenomenon in which when light is passed through a waveguide structure that has a property of total internal reflection (when light strikes a medium boundary at an angle causing substantially no light to pass through the boundary, and substantially all of the light being reflected), there might be attenuated reflection occurring at the medium boundary. Thus, the light entering and passing a waveguide structure that is showing an ATR effect (an ATR structure) may generate a surface plasmon along a surface of the ATR structure. The surface plasmon may cause an evanescent wave, which has a sub-diffraction characteristic.

In some embodiments, such an ATR structure may be used by conventional lithographic equipments to perform nano-lithography. The conventional lithographic equipments, which may not have the capability to perform nano-lithography without using the ATR structure, may direct its existing lithographic light source (with photons having a constant quantum energy of hv, h being a Planck constant, and v being a frequency of light) into the ATR structure, causing the surface of the ATR structure to emit surface plasmon and evanescent wave. The evanescent wave, which has a shorter wavelength than the wavelength of the existing lithographic light source, may then be used as a lithographic light source to fabricate semiconductor nano-structures. The above process may be broadly referred to as a "plasmonic nano-lithography" technique. Thus, the plasmonic nano-lithography may greatly improve the resolution of the optical lithography, and reduce the needs for complicated and expensive fabrication equipments.

FIG. 1A shows a semiconductor structure during a conventional lithographic operation. In FIG. 1A, a semiconductor structure may have a layer of photoresist 130 and a layer of substrate 140 beneath the layer of photoresist 130. A photolithographic mask 120, which may be coupled to a material made of quartz substrate 115, may be positioned above the semiconductor structure. During lithographic operation, lithographic light beams 110 may be projected from a lithographic light source (not shown in FIG. 1) in a direction that is substantially perpendicular with respect to a plane associated with the photolithographic mask 120 and the semiconductor structure. In other words, the lithographic light beams 110 may be transmitted toward the surface of the semiconductor structure through the photolithographic mask 120. The photolithographic mask 120 may block portions of the lithographic light beams 110, while allowing other portions of the lithographic light beams 110 to pass through and reach the exposed layer of photoresist 130, causing litho-chemical reactions.

Figure 1B:
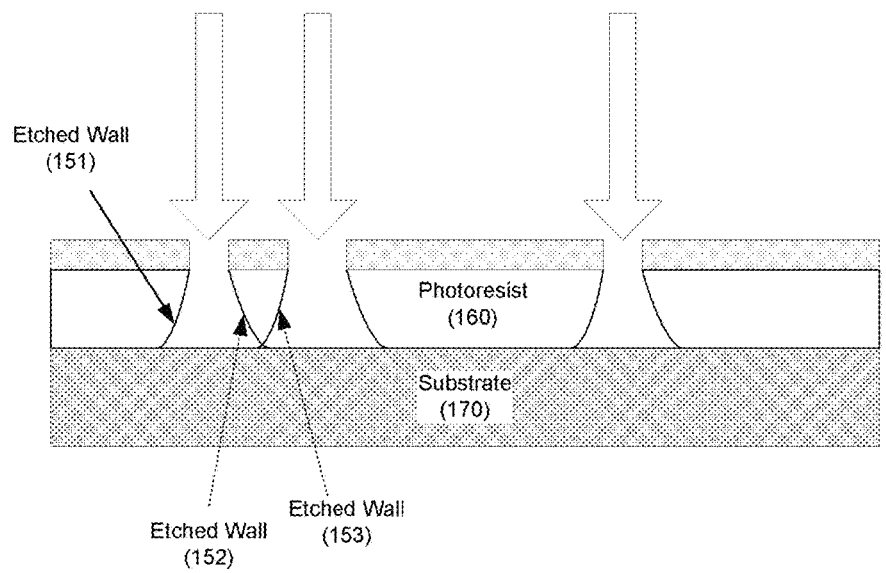
FIG. 1B shows a semiconductor structure exhibiting optical diffraction effects during a conventional lithographic operation.

FIG. 1B shows a semiconductor structure exhibiting optical diffraction effects during a conventional lithographic operation. As light photons that are travelling in a straight line being blocked by non-transparent objects placed on their travelling path, the edges of the objects may cause diffraction effects. That is, the "straight" travelling light photons may show a wave form of propagation. As a result, the light photons may appear to "penetrate through" the objects that are supposedly blocking the light photons' travelling path.

When images on the photolithographic mask are projected onto the photoresist layer, resulting geometric patterns with sizes close to the wavelength of the lithography light beam, the lithography resolution may be greatly reduced due to these diffraction effects. For example, as indicated by FIG. 1B, after conventional lithography and etching of a photoresist 160, the resulting etched walls 151, 152, and 153 may no longer be straight, as intended. Moreover, the resulting etched photoresist 160 may have etched walls 152 and 153 that are in contact with each other. As a result of the above described conventional lithographic techniques, the generated semiconductor structure may become defective or unstable.

Conventional lithography processes may utilize various techniques in an attempt to minimize the diffraction effect as described above. For example, a 193 nm wave-length lithography may be adapted via complex and expensive lithographic equipments and peripherals in order to construct a semiconductor line having a width of 65 nm. With immersion lithography, a semiconductor line having 45 nm line width or 32 nm line width may be achieved with 193 nm wavelength lithography as well. However, the present disclosure recognizes and appreciates that it is hard for conventional lithography equipments to overcome resolution limitations due to optical diffraction effects, such that next generation chip fabrication may be difficult as the size of the fabricated semiconductor components are getting into nanometer level.

Figure 2A:
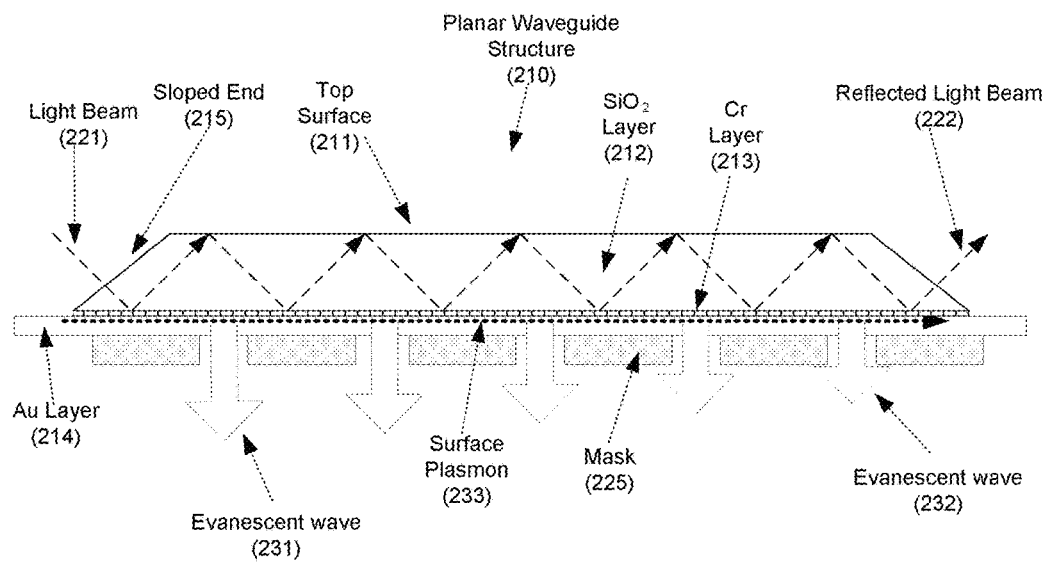
FIG. 2A shows an example lithographic structure for achieving attenuated total reflection.

FIG. 2A shows an example lithographic structure for achieving attenuated total reflection, in accordance with at least some embodiments of the present disclosure. In FIG. 2A, the lithographic structure contains a planar waveguide structure 210, which is bound with a mask 225. The planar waveguide structure 210 may be a physical structure that is configured to guide electromagnetic waves such as light, infrared, or other planar waves in various spectrums. The mask 225 may be a photolithographic mask having patterns defined by a metal (e.g., chrome) absorbing film.

In some embodiments, the planar waveguide structure 210 may be a structure that includes multiple layers (e.g., a top layer 212, a binding layer 213, and a bottom layer 214) of materials with different dielectric characteristics, resulting in these multiple layers 212, 213 and 214 having different refractive indices. The top layer 212 may be a silicon dioxide ($SiO_2$) layer. The bottom layer 214 may be based on a material that can cause surface plasmon excitation. In some embodiments, this surface-plasmon-excitation material may be a type of metal such as gold (Au). The binding layer 213 may be a binding film of chromium (Cr) configured to couple the top layer 212 with the bottom layer 214. In some embodiments, the binding layer 213 may be made of other materials such as Titanium (Ti) to enhance the adhesiveness of the binding layer 213. The binding layer 213 may have a thickness of about 1-2 nm, and the bottom layer 214 may have a thickness of about 50 nm.

In some embodiments, the planar waveguide structure 210 may have a sloped end 215 adapted so that a light beam 221 may be injected, directly or via a lens, through the sloped end 215 and into the $SiO_2$ layer 212. Alternative to the sloped end 215, a grating structure or a prism may be used to direct the light beam 221 into the planar waveguide structure 210. The incident light beam 221 that passes through the $SiO_2$ layer 212 of the planar waveguide structure 210 may be a laser beam, may have a wavelength such as, without limitation, about 365 nm, about 248 nm, and/or about 193 nm, and may be generated by a light source of a photolithographic equipment.

In some embodiments, the planar waveguide structure 210 may have a critical angle range. Depending on the refractive indices of the materials in the $SiO_2$ layer 212, the Cr layer 213, and the Au layer 214, the light beam 221 that entering from one end of the planar waveguide structure 210 and passing through the $SiO_2$ layer 212 may reflect off the top surface 211 and the boundaries formed by the $SiO_2$ layer 212 and the Cr layer 213. Further, when the angle that the light beam 221 entering the one end of the planar waveguide structure 210 is within the critical angle range, then substantially no refraction of the light beam 221 may occur, and substantially all of the light beam 221 may be reflected off the top surface 211, and/or the boundary of $SiO_2$ layer 212 and Cr layer 213. Such an effect may be referred to as achieving a "total internal reflection." The reflected light beam may then be absorbed by the planar waveguide structure 210, or may exit the planar waveguide structure 210 from the other end, as indicated by the reflected light beam 222 in FIG. 2A.

In some embodiments, when the total internal reflection effect occurs, an attenuated total reflect (ATR) effect may also occur at the reflecting boundary between the two layers (e.g., the $SiO_2$ layer 212 and the Cr layer 213). That is, the reflecting of the light beam 221 off an inner surface (the surface that contacts the Cr layer 213) of the $SiO_2$ layer 212 may excite a surface plasmon 233 on one or both surfaces of the Au layer 214. As the light beam 221 propagates along the inner surface of the $SiO_2$ layer 212, the free electrons in proximity of the surfaces of the Au layer 214 may generate collectively electric dipole oscillation, resulting in the excitation of surface plasmon 233 due to Surface Plasmon Polaritons (SPP). In other words, the surface plasmon 233 may be caused by the photon electrical field generated by the reflecting light beam 221. The surface plasmon 233 may propagate at a direction along the surfaces of the Au layer 214. Therefore, even though the entire incident light beam 221 is reflected back into the originating medium (the $SiO_2$ layer 212), there is some energy penetrated into the Au layer 214 which is located at or near the reflecting boundary, and the surface plasmon 233 contains the electrons converted from such energy.

The surface plasmon 233 may further create/cause an electric field that extends into the surrounding areas along the traveling path of the surface plasmon 233. The energy in these extended areas may be referred to as the evanescent wave, since the amplitude of the wave decreases exponentially with the increasing in distance away from the surfaces of the Au layer 214. The evanescent waves 231 and 232 may decay over a distance of about several light wavelengths, and the effect of the evanescent waves 231 and 232 may be measurable within a short distance (e.g., approximately 300 nm, depending on the wavelength of the light beam 221) from the surfaces of the Au layer 214. Further, the evanescent waves 231 and 232 have sub-diffraction characteristics that may overcome conventional resolution limitations resulting from the diffraction effect. Specifically, sub-diffraction may refer to a diffraction that is occurring in a range that is less than a quarter of wave-length of light beam 221. Comparing to the conventional lithographic resolution which is limited by diffraction occurring at or below the wave length of the light beam 221, the evanescent waves' shorter wave length may allow a lithographic process to achieve a much higher resolution.

In some embodiments, the intensity of the incident light beam 221 may decay/fade while passing through the $SiO_2$ layer 212, and the intensity of the surface plasmon 233 may also decay accordingly. As a result, the intensity of the evanescent waves 231 and 232 may gradually decay along the planar waveguide structure 210. Thus, the evanescent wave 231 that is closer to the end of the planar waveguide structure 210 the light beam 221 enters in may have a higher intensity than the evanescent wave 232 that is closer to the other end of the planar waveguide structure 210 of which the reflected light beam exists out.

In some embodiments, since the resolution limitation due to the diffraction effect is in inverse proportion to the wave length of the conventional photolithographic light beam, by directing the conventional photolithographic light beam toward a planar waveguide structure 210, an ATR effect may be created, generating surface plasmon 233 that has a smaller wavelength than the conventional photolithographic light beam. That is, the surface plasmon 233 may have a wavelength that is less than the wavelength of the incident light beam 221. Further, the evanescent waves 231 and 232 may have a wavelength that is less than the wavelength of the light beam 221.

In some embodiments, due to the exponential-decaying nature of the evanescent waves 231 and 232, the planar waveguide structure 210 may be closely placed to, or bound with, the mask 225 having arbitrary (non-periodic) geometric patterns for various semiconductor nano-structures. The mask 225 may contain "holes" and/or transparencies that either allow light to pass through or block the light in a defined pattern. Since nano-lithography based on surface plasmon has a near-field exposure technology, the mask 225 may be attached/bounded or otherwise coupled to the planar waveguide structure 210 using a binding layer such as a Cr layer (not shown in FIG. 2A). As the evanescent waves are emitted across the bottom surface of the planar waveguide structure 210, there are no missing "gaps" that are typical from periodic patterning based on interference of surface plasmon waves.

In some embodiments, the planar waveguide structure 210 may be compatible with the mask 225 that is designed for a conventional photolithographic operation in which a photolithography light beam is transmitted toward the surface of the mask 225 in a direction that is substantially perpendicular to the surface of the mask 225. In other words, the mask 225, which is capable of being used in the conventional photolithographic operation, may be coupled to the planar waveguide structure 210, and used in the plasmonic nano-lithography as described below. Further, the photographic light beam used in the conventional photolithographic operation may also be adopted as the incident light beam 221, as long as the light path of the light beam 221 is changed from a substantially perpendicular direction to a substantially angled direction relative to the surface of the planar waveguide structure 210. Therefore, the present disclosure may provide a new lithography process that not only reduces/eliminates diffraction effects, but also is compatible with conventional lithographic equipments and lithographic processes.

Figure 2B:
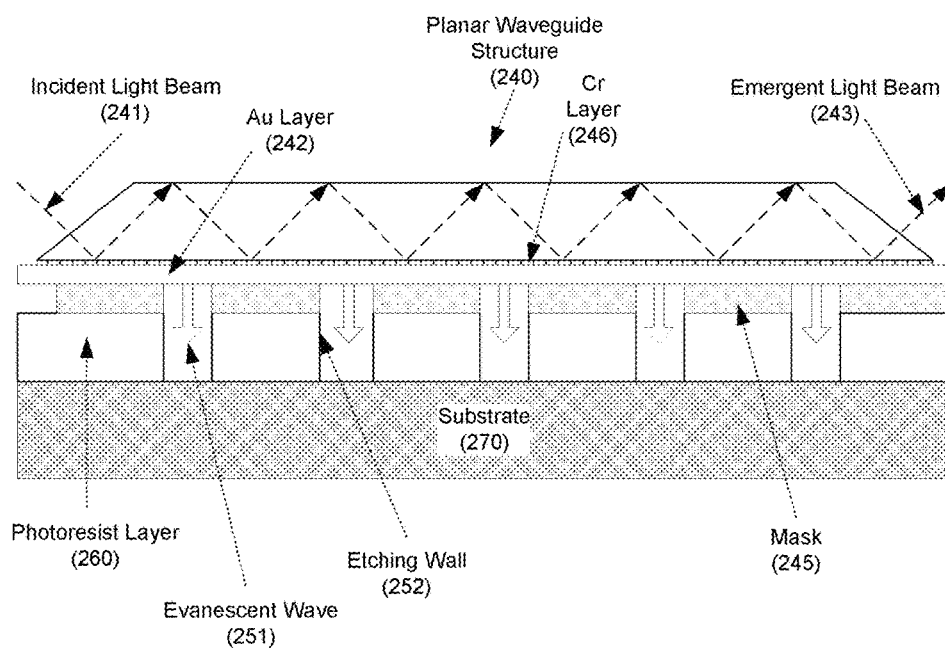
FIG. 2B shows an example lithographic structure being used during a plasmonic nano-lithography operation.

FIG. 2B shows an example lithographic structure being used during a plasmonic nano-lithography operation, in accordance with at least some embodiments of the present disclosure. In FIG. 2B, the lithographic structure contains a planar waveguide structure 240, which is bound with a mask 245 via a Cr layer 246. The lithographic structure may be placed close to, or coupled to a photoresist layer 260 which is deposited on a surface of a substrate 270. In some embodiments, the planar waveguide structure 240 may have a shape and structure that are similar to the planar waveguide structure 210 of FIG. 2A.

In some embodiments, an incident light beam 241 may enter from a sloped end of the planar waveguide structure 240, and pass through the planar waveguide structure 240. The incident light beam 241 may be reflected off the internal surfaces of the planar waveguide structure 240, which may achieve a total internal reflection, before exiting the planar waveguide structure 240 as emergent light beam 243.

In some embodiments, the planar waveguide structure 240 may emit evanescent wave 251 from an Au layer 242 of the planar waveguide structure 240 when the incident light beam 241 passes through the internal of the planar waveguide structure 240. The evanescent wave 251 may be the result of an ATR, which generates a surface plasmon (not shown in FIG. 2B) on the surfaces of the Au layer 242. The evanescent wave 251 may be caused by the surface plasmon, and may have a sub-diffraction characteristic. Thus, the photoresist layer 260 may be placed within the effective range of the evanescent wave 251 for dry-etching or plasma-etching the photoresist layer 260. Since there is little or no diffraction effect, the etched wall 252 that results may be substantially vertical and straight. Further, there is little or no difference in applying the evanescent wave 251 to the photoresist layer 260, comparing to a conventional lithographic light beam in lithographic processes.

Figure 3:
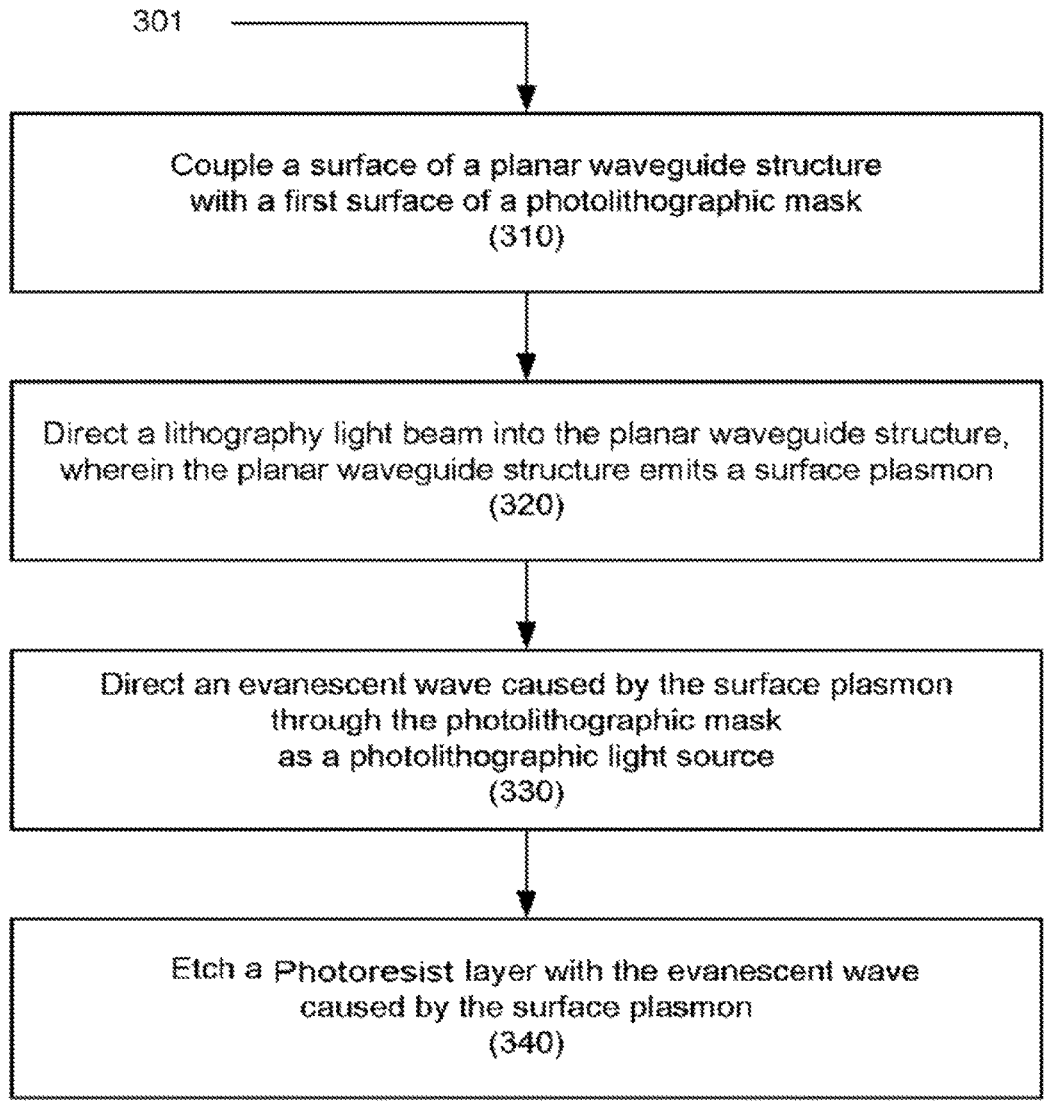
FIG. 3 shows a flow diagram of an illustrative embodiment of a process for performing semiconductor fabrication by a lithographic equipment utilizing a planar waveguide structure.

FIG. 3 shows a flow diagram of an illustrative embodiment of a process 301 for performing semiconductor fabrication by lithographic equipment utilizing a planar waveguide structure, arranged in accordance with at least some embodiments of the present disclosure. The process 301 sets forth various functional blocks or actions that may be described as processing steps, functional operations, events, and/or acts, which may be performed by hardware, software, and/or firmware. Those skilled in the art in light of the present disclosure will recognize that numerous alternatives to the functional blocks shown in FIG. 3 may be practiced in various implementations.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. Moreover, one or more of the outlined steps and operations may be performed in parallel.

Process 301 may begin at block 310. At block 310, a planar waveguide structure may be coupled with a first surface of a photolithographic mask. In some embodiments, the planar waveguide structure may be constructed using a silicon dioxide ($SiO_2$) layer, a binding layer using Cr, and a metal (e.g., Au) layer. Further, the planar waveguide structure may have a sloped end, allowing a lithograph light beam to enter the interior of the planar waveguide structure. The planar waveguide structure may be coupled with the first surface of the photolithographic mask using another binding layer (e.g., a Cr layer). That is, the planar waveguide structure may be coupled to a first surface of the binding layer, and the first surface of the photolithographic mask may be coupled to a second surface (opposite to the first surface of the binding layer) of the binding layer. In some embodiments, lithographic equipment may be configured to couple the planar waveguide structure with the photolithographic mask during a photolithographic operation. Alternatively, the planar waveguide structure may be coupled with the photolithographic mask to form a lithographic structure beforehand. Block 310 may be followed by block 320.

At block 320, the lithographic equipment may be configured to direct a lithography light beam into the planar waveguide structure. In some embodiments, the lithography light beam may achieve a total internal reflection when being reflected off the internal surfaces of the planar waveguide structure. Further, when the lithography light beam is reflected off an internal surface (inner surface of the $SiO_2$ layer) of the planar waveguide structure, the planar waveguide structure may emit a surface plasmon on the surfaces of the metal layer, effectuating an ATR. Block 320 may be followed by block 330.

At block 330, an evanescent wave caused by the surface plasmon may have a sub-diffraction characteristic and may be adopted for lithographic process. The evanescent wave may be used as a photolithographic light source for the photolithographic operation. The lithographic equipment may be configured to direct the evanescent wave created from the surface plasmon through the photolithographic mask. Block 330 may be followed by block 340.

At block 340, the lithographic equipment may be configured to etch a photoresist layer with the evanescent wave created from the surface plasmon. Specifically, the lithographic equipment may effectively couple the photoresist layer with a second surface of the photolithographic mask which is opposite to the first surface of the photolithographic mask. Afterward, the lithographic equipment may be configured to direct the lithography light beam into the planar waveguide structure, which in turn emits the surface plasmon and creates the evanescent wave that may be utilized to illuminate the photoresist layer.

Figure 4:
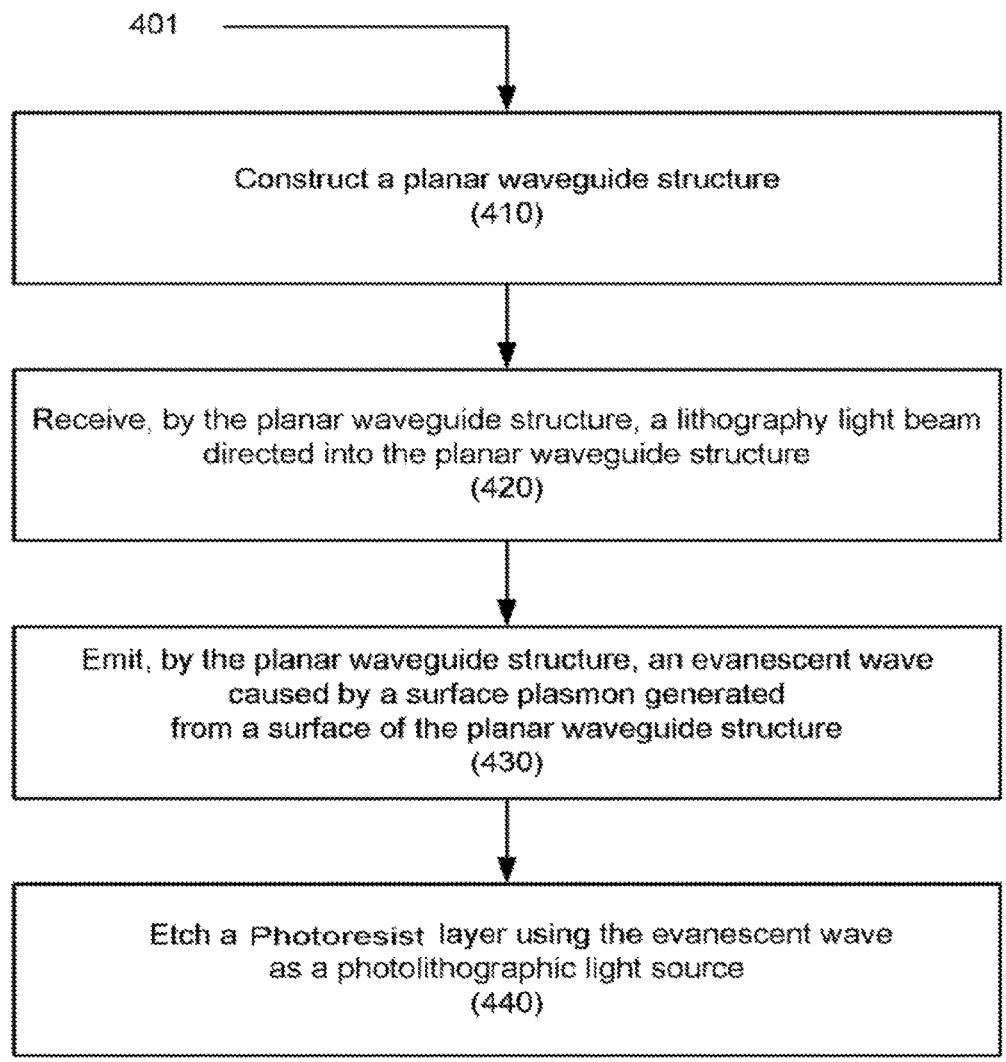
FIG. 4 shows a flow diagram of an illustrative embodiment of a process 401 for using a planar waveguide structure for plasmonic nano-lithography.

FIG. 4 shows a flow diagram of an illustrative embodiment of a process 401 for using a planar waveguide structure for plasmonic nano-lithography, in accordance with at least some embodiments of the present disclosure. The process 401 sets forth various functional blocks or actions that may be described as processing steps, functional operations, events, and/or acts, which may be performed by hardware, software, and/or firmware. Those skilled in the art in light of the present disclosure will recognize that numerous alternatives to the functional blocks shown in FIG. 4 may be practiced in various implementations.

Process 401 may begin at block 410. At block 410, a planar waveguide structure may be constructed, as described above. Block 410 may be followed by block 420.

At block 420, the planar waveguide structure may be configured to receive a lithography light beam that can be directed into the planar waveguide structure. The lithography light beam may achieve a total internal reflection while passing through the planar waveguide structure and reflecting off the internal surfaces of the planar waveguide structure. Block 420 may be followed by block 430.

At block 430, the planar waveguide structure may emit an evanescent wave, which is caused by a surface plasmon generated from a surface of the planar waveguide structure. The surface plasmon may be generated by the lithography light beam reflecting off one of the internal surfaces of the planar waveguide structure, which in turn achieves attenuated total reflection. In some embodiments, the planar waveguide structure may have a metal layer for emitting the surface plasmon from surfaces of the metal layer when the lithography light beam is reflected in the planar waveguide structure. Block 430 may be followed by block 440.

At block 440, the planar waveguide structure may be coupled to a photolithographic mask for a photolithographic operation that utilizes the evanescent wave caused by the surface plasmon as a photolithographic light source. A lithographic equipment may etch a photoresist layer using the evanescent wave.

Figure 5:
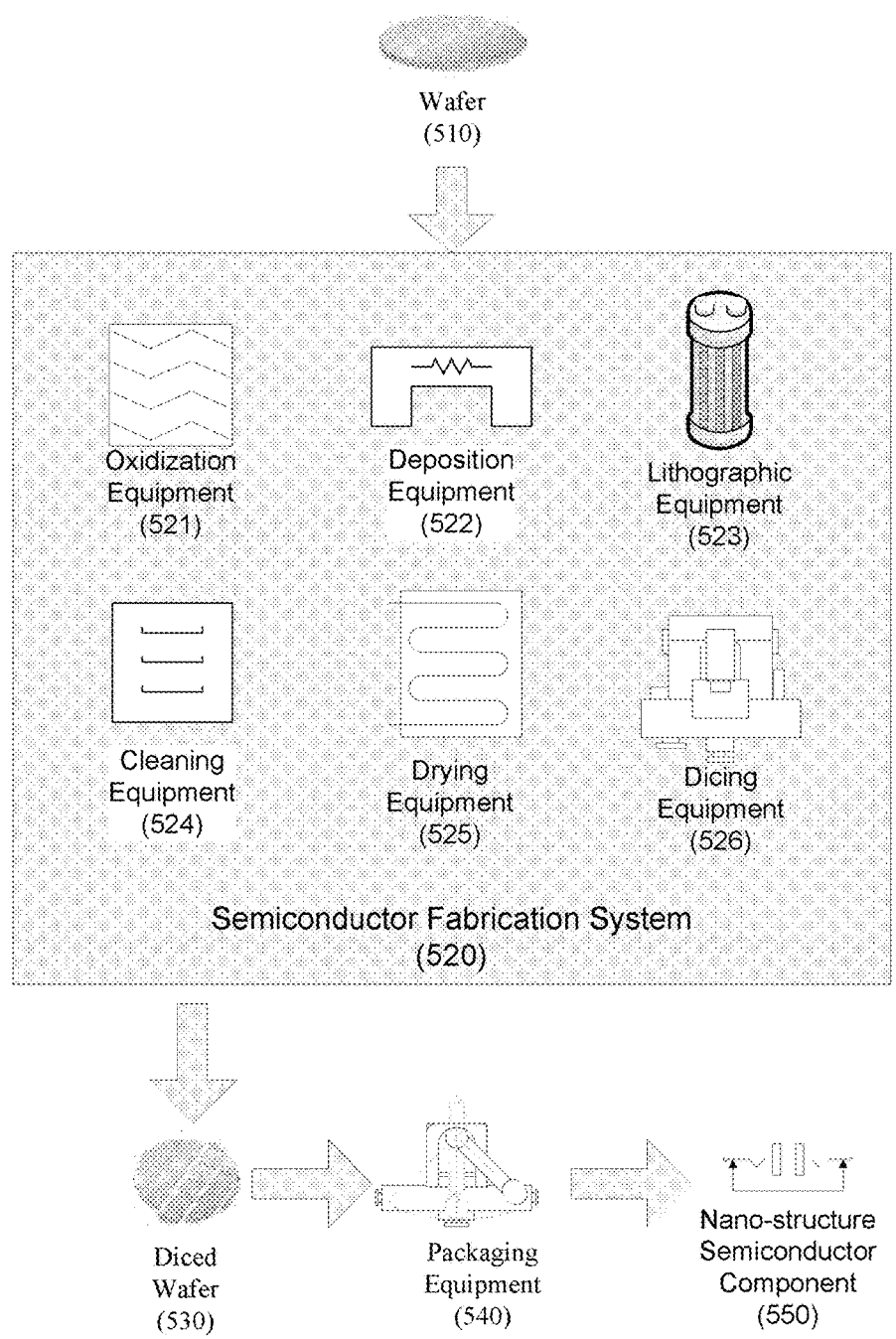
FIG. 5 illustrates example embodiments of a semiconductor fabrication system in an operational environment, all arranged in accordance to at least some embodiments of the present disclosure.

FIG. 5 illustrates an example semiconductor fabrication system in an operational environment, all arranged in accordance to at least some embodiments of the present disclosure. In FIG. 5, a semiconductor fabrication system 520 may contain equipment for fabricating a wafer 510 into a nano-structure semiconductor component 550. The semiconductor fabrication system 520 may include, without limitation, oxidation equipment 521, deposition equipment 522, lithographic equipment 523, cleaning equipment 524, drying equipment 525, and dicing equipment 526. A wafer 510, which may be a thin slice of semiconductor material (e.g., silicon crystal), may be processed by equipment from the above semiconductor fabrication system 520 one or more times based on the operation routes, the end product's specifications and the manufacturing recipes.

In some embodiments, the oxidization equipment 521 may be configured to perform one or more of thermal oxidation, wet anodization, chemical vapor deposition (CVD), and/or plasma anodization or oxidation operations. The oxidation equipment 521 may be configured to oxidize the surface of the wafer 510 in order to form a layer of silicon dioxide, as may be desired.

The deposition equipment 522 may be configured to deposit a layer of specific material over the wafer 510. In some embodiments, a photoresist layer may be deposited above a surface of the wafer 510.

The lithographic equipment 523 may be configured to perform wet-etching, dry-etching, or plasma-etching operations in order to construct and/or remove portions of semiconductor layers. In some embodiments, the lithographic equipment 523 may adopt a planar waveguide structure, which may be configured to emit surface plasmon and create evanescent wave to perform one or more of the above described lithographic operations.

The cleaning equipment 524 may be configured to rinse and clean the surface of semiconductor components after the deposition, etching, and/or dicing operations. The drying equipment 525 may be configured to dry the semiconductor components by applying air or heat.

The dicing equipment 526 may be configured to dice a fabricated silicon wafer into a diced wafer 530. Afterward, the silicon wafer may be cut/diced into a plurality of wafer segments, each of which may be used to construct a finished product. The wafer segments may then be packaged by a packaging equipment 540, and a final product, such as the nano-structure semiconductor component 550, may be generated.

Thus, methods and systems for plasmonic nano-lithography based on ATR have been described. Although the present disclosure has been described with reference to specific example embodiments, it will be recognized that the disclosure is not limited to the embodiments described, but can be practiced with modification and alteration within the spirit and scope of the appended claims. Accordingly, the specification and drawings are to be regarded in an illustrative sense rather than a restrictive sense.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In some embodiments, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive (HDD), a Compact Disc (CD), a Digital Versatile Disk (DVD), a digital tape, a computer memory; and a transmission type medium such as a digital and/or an analog communication medium (e.g., a fiber optic cable, a waveguide, a wired communication link, a wireless communication link).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to"). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

I claim:

1. A method to perform semiconductor fabrication, the method comprising:
    coupling, by a lithographic equipment, a surface of a planar waveguide structure with a first surface of a photolithographic mask;
    directing, by the lithographic equipment, a lithography light beam into the planar waveguide structure, causing a surface plasmon to be emitted from the surface of the planar waveguide structure when the lithography light beam is reflected by internal surfaces of the planar waveguide structure, effectuating an attenuated total reflection; and
    directing, by the lithographic equipment, an evanescent wave caused by the surface plasmon through the photolithographic mask, wherein the evanescent wave has a sub-diffraction characteristic and is used as a photolithographic light source.

2. The method as recited in claim 1, further comprising:
    etching, by the lithographic equipment, a photoresist layer with the evanescent wave, wherein the photoresist layer is coupled with a second surface of the photolithographic mask.

3. The method as recited in claim 2, wherein the photoresist layer is coupled to the second surface of the photolithographic mask.

4. The method as recited in claim 1, wherein the planar waveguide structure is coupled to the photolithographic mask via a chromium (Cr) layer.

5. The method as recited in claim 1, wherein the planar waveguide structure utilizes a gold (Au) layer as a material for emitting the surface plasmon.

6. The method as recited in claim 1, wherein the planar waveguide structure is constructed using a silicon dioxide ($SiO_2$) layer, a chromium (Cr) layer, and a gold (Au) layer.

7. The method as recited in claim 1, wherein a thickness of the planar waveguide structure approximately corresponds to a wavelength of the surface plasmon.

8. The method as recited in claim 1, wherein directing the lithography light beam comprises:
    directing the lithography light beam toward a sloped end of the planar waveguide structure at an angle that allows the lithography light beam to achieve a total internal reflection when passing through the planar waveguide structure.

9. A method to perform semiconductor fabrication, the method comprising:
    receiving, by a planar waveguide structure, a lithography light beam directed into the planar waveguide structure, wherein the lithography light beam achieves a total internal reflection while passing through the planar waveguide structure and causes a surface plasmon to be emitted from a surface of the planar waveguide structure; and emitting, by the planar waveguide structure, an evanescent wave caused by the surface plasmon, wherein the evanescent wave is effective as a photolithographic light source.

10. The method as recited in claim 9, wherein the planar waveguide structure has a metal layer adapted to emit the surface plasmon from a first surface of the metal layer when the lithography light beam is reflected in the planar waveguide structure.

11. The method as recited in claim 10, wherein the metal layer is a gold (Au) layer.

12. The method as recited in claim 9, wherein the planar waveguide structure is constructed using a silicon dioxide ($SiO_2$) layer, a chromium (Cr) layer, and a gold (Au) layer.

13. The method as recited in claim 9, wherein the planar waveguide structure is coupled to a photolithographic mask for a photolithographic operation that utilizes the evanescent wave as the photolithographic light source.

14. A lithographic structure for semiconductor fabrication, the lithographic structure comprising:
 a photolithographic mask configured for a photolithographic operation;
 a planar waveguide structure configured to emit a surface plasmon when a lithography light beam reflects off internal surfaces of the planar waveguide structure and achieves an attenuated total reflection; and
 a bonding layer configured to couple the photolithographic mask with the planar waveguide structure, that allows an evanescent wave created from the emitted surface plasmon to pass through the photolithographic mask.

15. The lithographic structure as recited in claim 14, wherein the photolithographic mask is further configured to be used in an etching operation in which the lithography light beam is projected in a direction that is substantially perpendicular to a plane associated with the photolithographic mask.

16. The lithographic structure as recited in claim 14, wherein the bonding layer is a chromium (Cr) layer.

17. The lithographic structure as recited in claim 14, wherein the planar waveguide structure contains a gold (Au) layer as a material for emitting the surface plasmon.

18. The lithographic structure as recited in claim 14, wherein the planar waveguide structure contains a silicon dioxide ($SiO_2$) layer, a chromium (Cr) layer, and a gold (Au) layer.

19. The lithographic structure as recited in claim 14, wherein the planar waveguide structure has a sloped end that allows the lithography light beam to enter into the planar waveguide structure at an angle that achieves a total internal reflection when the lithography light beam reflects off the internal surfaces of the planar waveguide structure.

20. The lithographic structure as recited in claim 14, wherein the evanescent wave has a sub-diffraction characteristic.

* * * * *